(12) United States Patent
Yun et al.

(10) Patent No.: US 11,563,065 B2
(45) Date of Patent: Jan. 24, 2023

(54) DISPLAY DEVICE IN WHICH EMISSION LAYER IS INTEGRALLY FORMED WITH RESPECT TO PIXEL GROUP

(71) Applicant: LG Display Co., Ltd., Seoul (KR)

(72) Inventors: Jaekyeong Yun, Paju-si (KR); Hojin Ryu, Paju-si (KR); Sangpyo Hong, Paju-si (KR); Hyodae Bae, Paju-si (KR); Soojin Kim, Paju-si (KR); Samjong Lee, Paju-si (KR); Jeonphill Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 113 days.

(21) Appl. No.: 17/124,365

(22) Filed: Dec. 16, 2020

(65) Prior Publication Data

US 2021/0193762 A1 Jun. 24, 2021

(30) Foreign Application Priority Data

Dec. 18, 2019 (KR) .......................... 10-2019-0169627

(51) Int. Cl.
*H01L 27/32* (2006.01)
(52) U.S. Cl.
CPC ...... *H01L 27/3246* (2013.01); *H01L 27/3211* (2013.01); *H01L 27/3272* (2013.01)

(58) Field of Classification Search
CPC ............. H01L 27/3246; H01L 27/3211; H01L 27/3272
USPC .......................................................... 257/72
See application file for complete search history.

(56) References Cited

U.S. PATENT DOCUMENTS

2021/0217829 A1* 7/2021 Hsu ..................... H01L 27/3246

FOREIGN PATENT DOCUMENTS

| KR | 10-2017-0080242 A | 7/2017 |
|---|---|---|
| KR | 10-1780009 B1 | 9/2017 |

* cited by examiner

*Primary Examiner* — Xia L Cross
(74) *Attorney, Agent, or Firm* — Polsinelli PC

(57) ABSTRACT

A display device including a substrate in which pixel groups each composed of two or more pixels adjacent in a column direction are arranged; a circuit element layer in which driving transistors driving the pixels are arranged; electrodes placed on the circuit element layer, and electrically connected to the driving transistors through via holes, respectively; a bank surrounding each of the pixel groups, and placed to cover at least a part of an edge of the electrodes; and emission layers formed within areas surrounded by the bank, wherein the pixel groups are arranged in a zigzag shape with respect to a row direction.

14 Claims, 13 Drawing Sheets

DISPLAY DEVICE IN WHICH EMISSION LAYER IS INTEGRALLY FORMED WITH RESPECT TO PIXEL GROUP

CROSS-REFERENCE TO RELATED APPLICATION

The present application claims priority to Korean Patent Application No. 10-2019-0169627, filed Dec. 18, 2019, which is hereby incorporated by reference in its entirety.

Field of the Disclosure

The present disclosure relates to a display device.

Description of the Related Art

As information society has developed, various types of display devices have been developed. In recent years, various display devices, such as a liquid crystal display (LCD), a plasma display panel (PDP), and an organic light-emitting diode (OLED) display, have been used.

Organic light-emitting elements constituting an organic light-emitting diode display are self-luminous and do not require a separate light source, so that the thickness and the weight of the display device are reduced. In addition, the organic light-emitting diode display has high quality characteristics, such as low power consumption, high luminance, and a high response rate.

Recently, a technology for forming an emission layer of an organic light-emitting element through a solution process with use of inkjet equipment, and the like has been developed. The solution process is performed by applying a solution for forming an emission layer in a set area and then drying the solution.

The foregoing is intended merely to aid in the understanding of the background of the present disclosure, and is not intended to mean that the present disclosure falls within the purview of the related art that is already known to those skilled in the art.

SUMMARY

Accordingly, the present disclosure is to provide a display device in which pixels arranged in the same pixel column are grouped by a preset number and an emission layer is formed integrally for each of the pixel groups.

The present disclosure also provides a display device in which the pixel groups are arranged in a zigzag shape in a row direction.

The present disclosure also provides a display device in which a contact hole between an anode electrode and a driving transistor is disposed to overlap a bank, at the boundary between the pixel groups.

The present disclosure also provides a display device in which to place such a contact hole, a layout is mirrored with respect to pixels adjacent in a column direction.

According to an aspect of the present disclosure, there is provided a display device including: a substrate in which pixel groups each composed of two or more pixels adjacent in a column direction are arranged; a circuit element layer in which driving transistors driving the pixels are arranged; electrodes placed on the circuit element layer, and electrically connected to the driving transistors through via holes, respectively; a bank surrounding each of the pixel groups, and placed to cover at least a part of an edge of the electrodes; and emission layers formed within areas surrounded by the bank, wherein the pixel groups are arranged in a zigzag shape with respect to a row direction.

The bank may include: a first bank surrounding each of the pixels; and a second bank being on the first bank, and surrounding each of the pixel groups.

The bank may include: a first bank surrounding each of the pixel groups; and a second bank placed on the first bank.

The bank may include: a first bank placed between the pixels within the pixel groups; and a second bank surrounding each of the pixel groups.

The via hole may be disposed to overlap the second bank.

Each of the pixel groups may include: a first pixel; and a second pixel of which a first side is disposed adjacent to a first side of the first pixel, wherein the via hole of the first pixel is disposed to overlap the second bank on a second side of the first pixel, and wherein the via hole of the second pixel is disposed to overlap the second bank on a second side of the second pixel.

A layout of the first pixel and a layout of the second pixel may be symmetric with respect to the row direction.

The circuit element layer may comprises: a first conductive layer formed on the substrate, and including a light blocking layer; a buffer layer covering the light blocking layer; an active layer placed on the buffer layer; a gate insulation layer placed on the active layer; a second conductive layer in which a gate electrode, a drain electrode, and a source electrode of the driving transistor are placed, the second conductive layer being placed on the gate insulation layer; and an overcoat layer covering the second conductive layer, wherein the electrodes are connected to the light blocking layer through the via hole overlapping the first bank, and the light blocking layer is connected to the drain electrode of the driving transistor through a contact hole.

Some of the via holes may be disposed overlapping with the second bank that surrounds each of the pixel groups, and the other via holes may be disposed between the pixels within the pixel groups.

Each of the pixel groups may include: a first pixel; and a second pixel of which a first side is disposed adjacent to a first side of the first pixel, wherein the via hole of the first pixel is disposed between the first pixel and the second pixel on a first side of the first pixel, and wherein the via hole of the second pixel is disposed to overlap the second bank on a second side of the second pixel.

A layout of the first pixel and a layout of the second pixel may be the same.

The emission layers may be formed integrally with respect to the two or more pixels constituting one pixel group.

The emission layers in central areas of the pixel groups may be formed in such a manner to be thicker than the emission layers in edge areas adjacent to the bank.

According to an aspect of the present disclosure, there is provided a display device including: a substrate in which pixel groups each composed of two or more pixels adjacent in a column direction are arranged; a circuit element layer in which driving transistors driving the pixels are arranged; electrodes placed on the circuit element layer, and electrically connected to the driving transistors through via holes, respectively; a bank surrounding each of the pixel groups, and placed to cover at least a part of an edge of the electrodes; and emission layers formed within an area surrounded by the bank, wherein the via holes are disposed to overlap the bank.

The bank may include: a first bank surrounding each of the pixels; and a second bank being on the first bank, and surrounding each of the pixel groups.

The bank may include: a first bank surrounding each of the pixel groups; and a second bank placed on the first bank.

The bank may include: a first bank placed between the pixels within the pixel groups; and a second bank surrounding each of the pixel groups.

The via hole may be disposed to overlap the second bank.

In the display device according to the present disclosure, when the emission layer is formed through a solution process, a pixel defect can be prevented from being transferred between the pixels within the pixel column, and uniformity in emission of light over the entire area of the display panel can be ensured.

BRIEF DESCRIPTION OF THE DRAWINGS

The above and other features, and other advantages of the present disclosure will be more clearly understood from the following detailed description when taken in conjunction with the accompanying drawings, in which.

DETAILED DESCRIPTION

Figure 1:
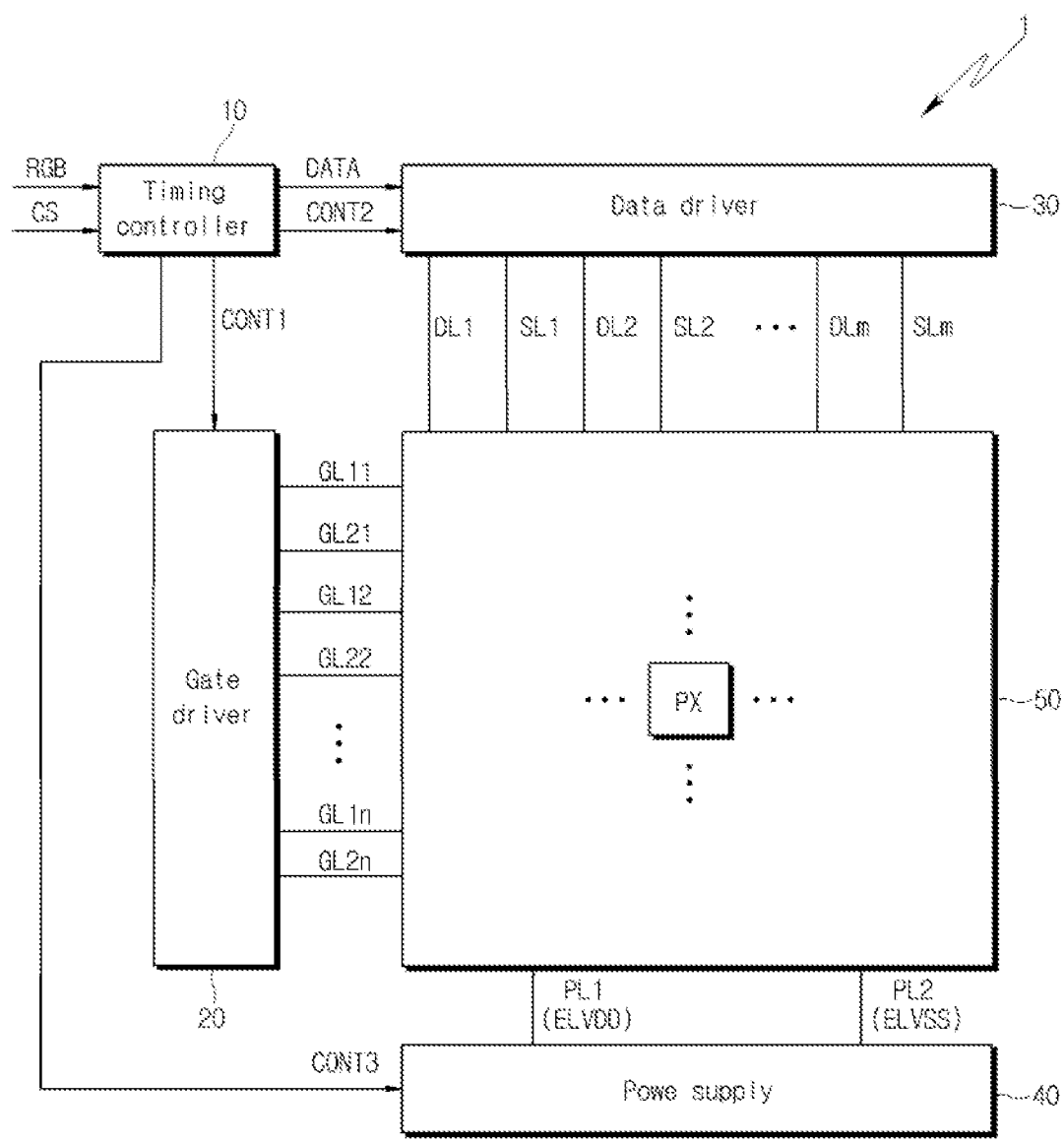
FIG. 1 is a block diagram showing a configuration of a display device according to an aspect of the present disclosure.

Hereinafter, aspects will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the aspects, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an aspect.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels PXs of the display panel 50 through multiple first gate lines GL11 to GL1n. The gate driver 20 may generate gate signals on the basis of the gate driving control signal CONT1 output from the timing controller 10. The gate driver 20 may provide the generated gate signals to the pixels PXs through the multiple first gate lines GL11 to GL1n.

In various aspects, the gate driver 20 may be further connected to the pixels PXs of the display panel 50 through multiple second gate lines GL21 to GL2n. The gate driver 20 may provide a sensing signal to the pixels PXs through the multiple second gate lines GL21 to GL2n. The sensing signal may be supplied so as to measure a characteristic of a driving transistor and/or a light-emitting element provided inside the pixels PXs.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

In various aspects, the data driver 30 may be further connected to the pixels PXs of the display panel 50 through multiple sensing lines (or reference lines) SL1 to SLm. The data driver 30 may provide a reference voltage (a sensing voltage, or an initialization voltage) to the pixels PXs through the multiple sensing lines SL1 to SLm, or may sense states of the pixels PXs on the basis of an electrical signal fed back from the pixels PXs.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the first gate lines GL11 to GL1n and the data lines DL1 to DLm, respectively.

Each pixel PX may display any one among a first to a third color. In an aspect, each pixel PX may display any one among red, green, and blue colors. In another aspect, each pixel PX may display any one among cyan, magenta, and yellow colors. In various aspects, the pixels PXs may be configured to display any one among four or more colors. For example, each pixel PX may display any one among red, green, blue, and white colors.

The timing controller 10, the gate driver 20, the data driver 30, and the power supply 40 may be configured as separate integrated circuits (ICs), or ICs in which at least some thereof are integrated. For example, at least one among the data driver 30 and the power supply 40 may be configured as an integrated circuit integrated with the timing controller 10.

In addition, in FIG. 1, the gate driver 20 and the data driver 30 are shown as elements separate from the display panel 50, but at least one among the gate driver 20 and the data driver 30 may be configured in an in-panel manner that is formed integrally with the display panel 50. For example, the gate driver 20 may be formed integrally with the display panel 50 according to a gate-in-panel (GIP) manner.

Figure 2:
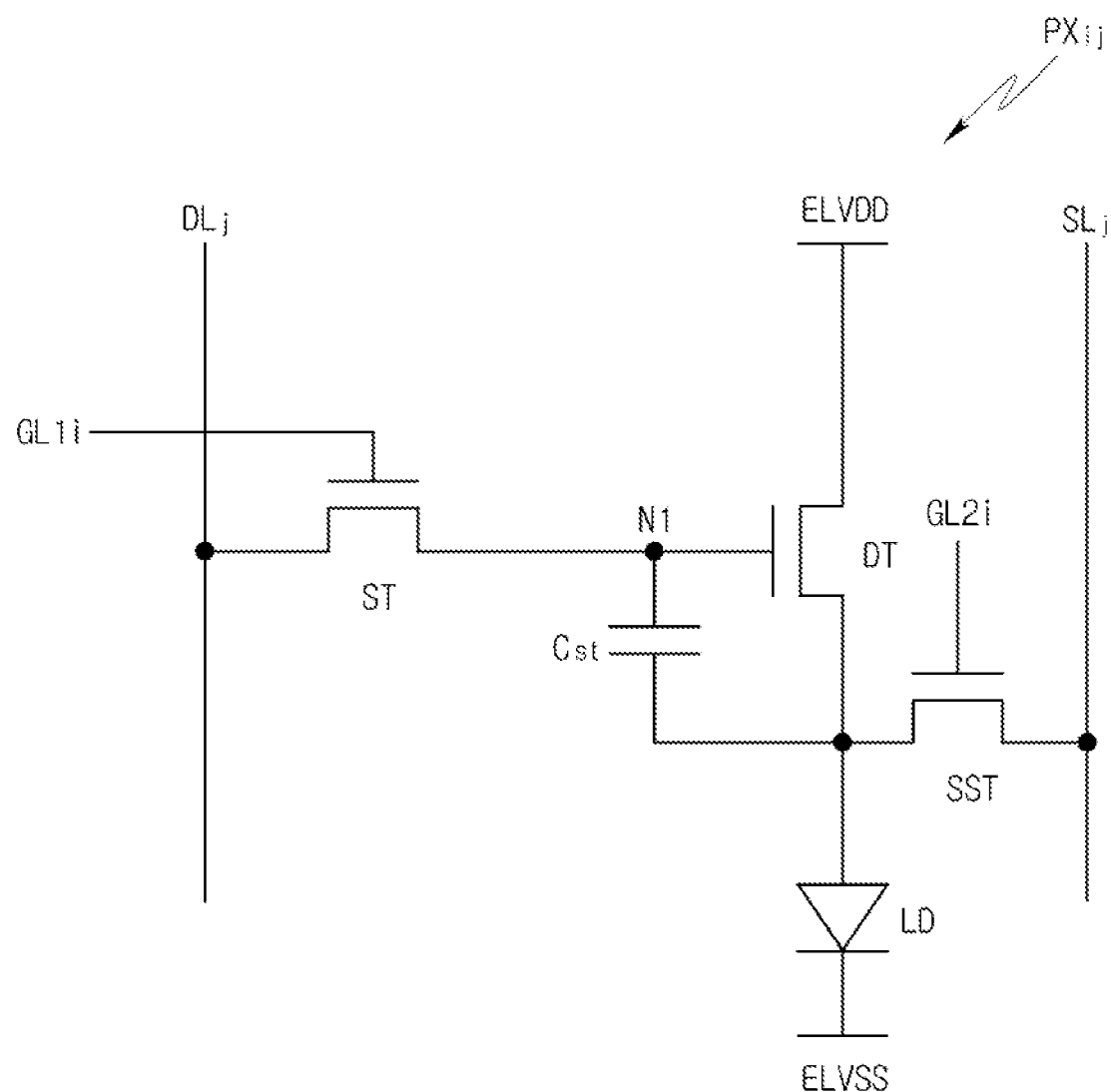
FIG. 2 is a circuit diagram showing a pixel according to an aspect of the present disclosure.

FIG. 2 is a circuit diagram showing an aspect of the pixel shown in FIG. 1. FIG. 2 shows, as an example, a pixel PXij that is connected to an i-th first gate line GL1i and a j-th data line DLj.

Referring to FIG. 2, a pixel PX includes a switching transistor ST, a driving transistor DT, a sensing transistor SST, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th first gate line GL1i. The switching transistor ST is turned on when a gate signal at a gate-on level is applied thereto through the i-th first gate line GL1i, and transmits a data signal applied through the j-th data line DLj, to the first node N1.

A first electrode of the storage capacitor Cst is electrically connected to the first node N1, and a second electrode of the storage capacitor Cst is connected to a first electrode of the light-emitting element LD. The storage capacitor Cst may be charged with a voltage corresponding to the difference between a voltage applied to the first node N1 and a voltage applied to the first electrode of the light-emitting element LD.

A first electrode (for example, a source electrode) of the driving transistor DT receives the high-potential driving voltage ELVDD, and a second electrode (for example, a drain electrode) of the driving transistor DT is electrically connected to the first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage applied to the gate electrode.

A first electrode (for example, a source electrode) of the sensing transistor SST is electrically connected to a j-th sensing line SLj, and a second electrode (for example, a drain electrode) of the sensing transistor SST is electrically connected to the first electrode (for example, an anode electrode) of the light-emitting element LD. A gate electrode of the sensing transistor SST is electrically connected to an i-th second gate line GL2i. The sensing transistor SST is turned on when a sensing signal at a gate-on level is applied through the i-th second gate line GL2i, and transmits a reference voltage applied through the j-th sensing line SLj, to the first electrode of the light-emitting element LD.

The light-emitting element LD outputs light corresponding to the driving current. The light-emitting element LD may output light corresponding to any one among red, green, blue, and white colors. The light-emitting element LD may be an organic light-emitting diode (OLED) or an ultra-small inorganic light-emitting diode having a size in a micro to nanoscale range, but this aspect is not limited thereto. Hereinafter, the technical idea of this aspect will be described with reference to an aspect in which the light-emitting element LD is an organic light-emitting diode.

In this aspect, the structure of the pixels PXijs is not limited to that shown in FIG. 2. According to an aspect, the pixels PXijs may further include at least one element for compensating for a threshold voltage of the driving transistor DT, or initializing a voltage of the gate electrode of the driving transistor DT and/or a voltage of the first electrode of the light-emitting element LD.

FIG. 2 shows an example in which the switching transistor ST, the driving transistor, and the sensing transistor SST are NMOS transistors, but the present disclosure is not limited thereto. For example, at least some or all of the transistors constituting each pixel PX may be configured as a PMOS transistor. In various aspects, each of the switching transistor ST, the driving transistor DT, and the sensing transistor SST may be implemented as a low-temperature polycrystalline silicon (LTPS) thin-film transistor, an oxide thin-film transistor, or a low-temperature polycrystalline oxide (LTPO) thin-film transistor.

Figure 3:
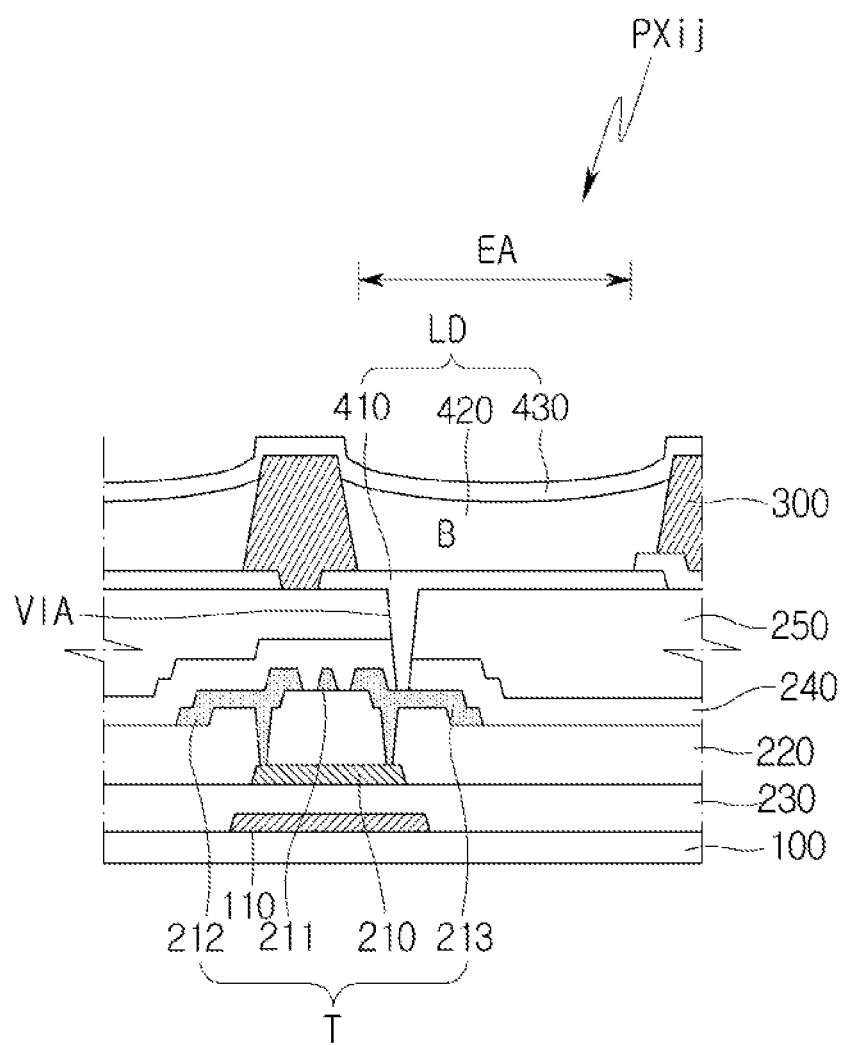
FIG. 3 is a cross-sectional view of a display panel according to an aspect of the present disclosure.

FIG. 3 is a cross-sectional view of a display panel according to an aspect. Particularly, FIG. 3 shows a detailed stack structure of an area in which a pixel PX is placed within the display panel 50.

Referring to FIG. 3, the display panel 50 according to an aspect may include a substrate 100, a circuit element layer, and a light-emitting element layer.

The substrate 100 is a base member of the display panel 50, and may be a light-transmissive substrate. The substrate 100 may be a rigid substrate including glass or tempered glass, or may be a flexible substrate made of a plastic material.

In an aspect, on the substrate 100, a light blocking layer 110 may be formed. When viewed from above, the light blocking layer 110 is placed in such a manner as to be overlapped with an active layer 210 of the transistor T, particularly, a channel area formed in the active layer 210, and may thus protect the element from external light.

The light blocking layer 110 may be covered by a buffer layer 230. The buffer layer 230 may prevent diffusion of ions or impurities from the substrate 100, and may block moisture penetration.

The circuit element layer may include circuit elements (for example, the switching transistor ST, the driving transistor DT, the storage capacitor Cst, and the like) and signal lines constituting the pixel PXij. The circuit element layer may be formed on the buffer layer 230.

First, above the substrate 100, the active layer 210 may be formed. The active layer 210 may be made of a silicon-based semiconductor material or an oxide-based semiconductor material.

On the active layer 210, a gate insulation layer 220 may be formed. On the gate insulation layer 220, a gate electrode 211, a source electrode 212, and a drain electrode 213 may be formed. The source electrode 212 and the drain electrode 213 may be connected to the active layer 210 through contact holes penetrating through the gate insulation layer 220.

The source electrode 212, the drain electrode 213, the gate electrode 211, and the active layer 210 corresponding thereto may constitute the transistor T. The transistor T may be, for example, the driving transistor DT or the switching transistor ST. FIG. 3 shows, as an example, the driving transistor DT of which the drain electrode 213 is connected to a first electrode 410 of the light-emitting element LD.

On the source electrode 212 and the drain electrode 213, a passivation layer 240 may be formed. The passivation layer 240 is an insulation layer for protecting the lower elements, and may be made of an inorganic material or an organic material.

In the circuit element layer, circuit elements such as various signal lines and capacitors that are not shown may be further formed. The signal lines may include, for example, gate lines GL1 and GL2, a data line DL, and the like described with reference to FIGS. 1 and 2.

On the passivation layer 240, an overcoat layer 250 may be formed. The overcoat layer 250 may be a planarizing film for reducing the step difference in the lower structure.

The light-emitting element layer is formed on the overcoat layer 250, and includes light-emitting elements LDs. The light-emitting element LD includes the first electrode 410, the emission layer 420, and a second electrode 430. The first electrode 410 may be an anode electrode, and the second electrode 430 may be a cathode electrode.

The first electrode 410 may be formed on the overcoat layer 250. The first electrode 410 is connected to the drain electrode 213 of the transistor T through the via hole VIA penetrating through the overcoat layer 250 and the passivation layer 240.

On the overcoat layer 250, a bank 300 may be further formed. The bank 300 may be a definition film defining an emission area EA of a pixel PX. The bank 300 is formed in such a manner as to cover a partial edge of the first electrode 410. The exposed area of the first electrode 410 which is not covered by the bank 300 may be defined as the emission area EA of the pixel PX. Within the emission area EA, the first electrode 410, the emission layer 420, and the second electrode 430 are stacked in such a manner as to be directly in contact with each other.

On the first electrode 410, the emission layer 420 is formed. The emission layer 420 is formed on an exposed partial area of the first electrode 410 which is not covered by the bank 300. That is, the emission layer 420 may be formed in the emission area EA defined by the bank 300.

The emission layer 420 may have a multi-layer thin-film structure including a light generation layer. For example, the emission layer 420 may include a hole transport layer (HTL), an organic emission layer, and an electron transport layer (ETL). In addition, the emission layer 420 may further include a hole injection layer (HIL), a hole blocking layer (HBL), an electron injection layer (EIL), and an electron blocking layer (EBL).

In this aspect, the emission layer 420 may be formed through a solution process using inkjet equipment, and the like. That is, the emission layer 420 may be formed by applying (dropping) a solution to an area surrounded by the bank 300, and drying the applied solution.

When the emission layer 420 is formed by the solution process, the difference in thickness between the central area of the emission layer 420 and the edge area adjacent to the bank 300 occurs (pile-up) due to the tension between the solution and the bank 300. For example, the emission layer 420 may be formed in a concave shape in which the central portion is thinnest and the area being in contact with the bank 300 is thickest. However, this aspect is not limited thereto. That is, in various aspects, structures for enhancing uniformity in thickness of the emission layer 420 may be placed, and the emission layer 420 may have a uniform thickness within the emission area EA.

The second electrode 430 is formed on the emission layer 420 and the bank 300. That is, the second electrode 430 may be formed to cover the emission layer 420 and the bank 300.

Although not shown, on the second electrode 430, an encapsulation layer may be formed. The encapsulation layer prevents external moisture from penetrating into the emission layer 420. The encapsulation layer may be made of an inorganic insulation material or may be formed in a structure in which an inorganic insulation material and an organic insulation material are alternately stacked, but is not necessarily limited thereto.

Figure 4:
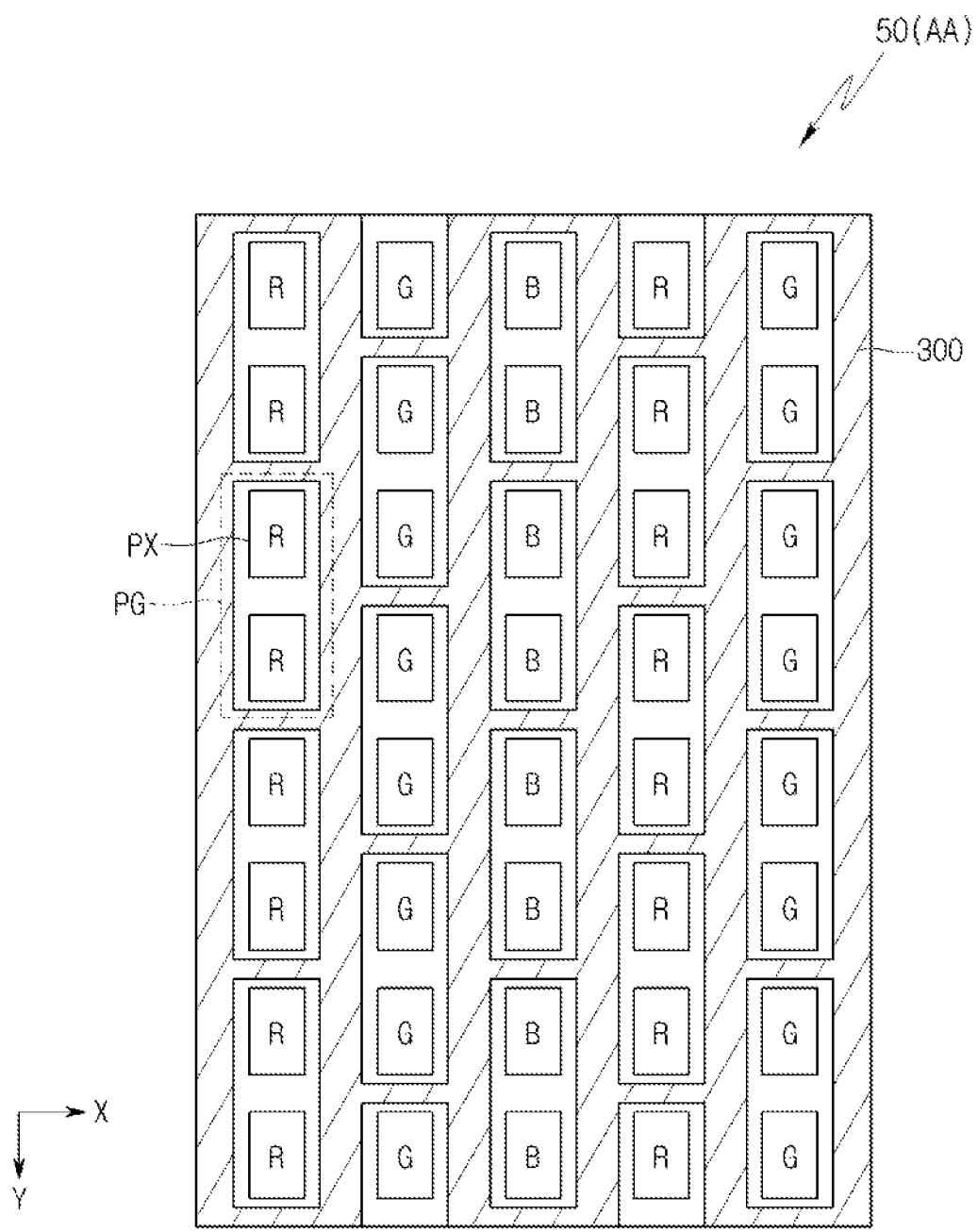
FIG. 4 is a schematic plan view of a display panel shown in FIG. 1 according to an aspect of the present disclosure.
Figure 5:
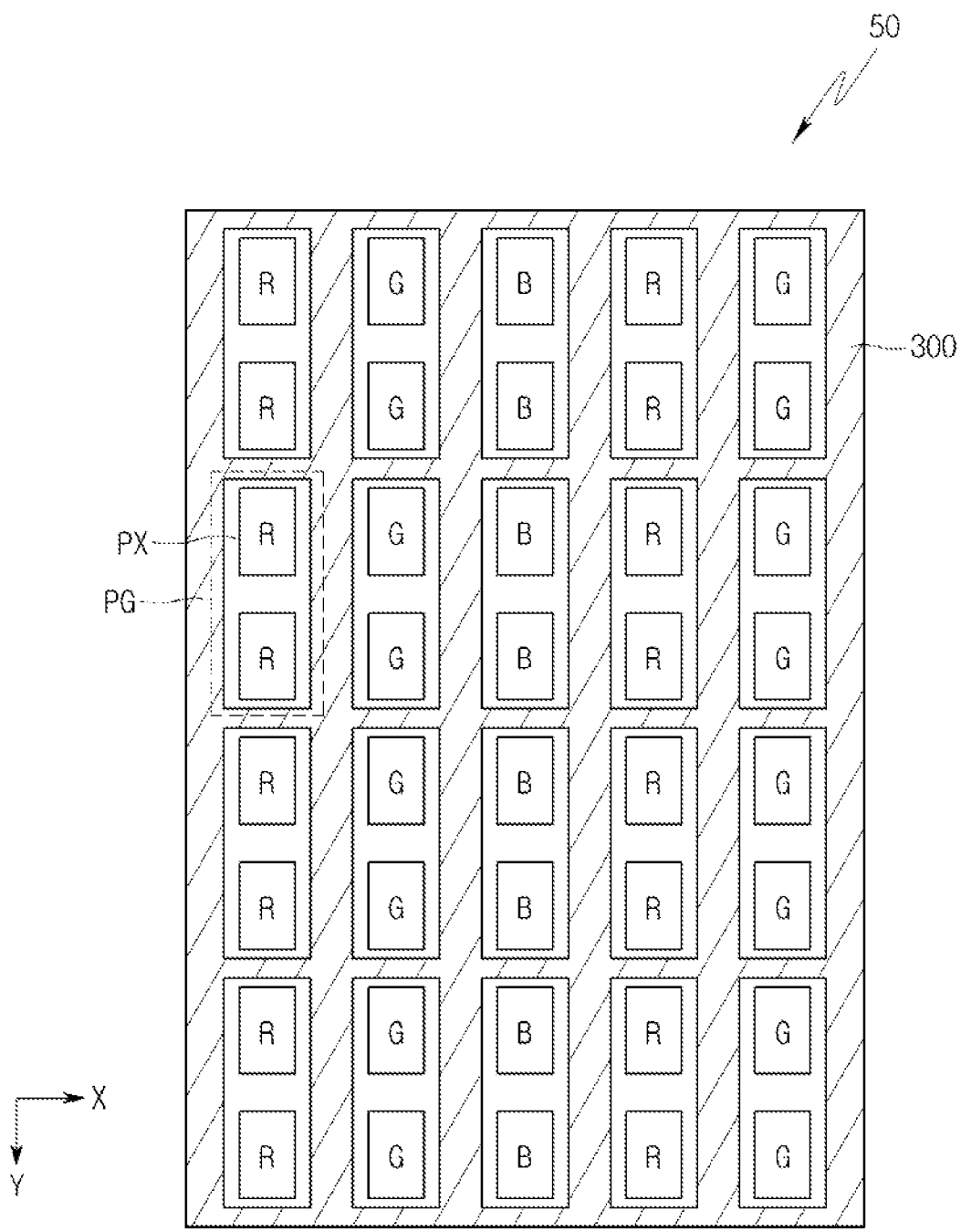
FIG. 5 is a schematic plan view of a display panel shown in FIG. 1 according to another aspect of the present disclosure.

FIG. 4 is a schematic plan view of an aspect of a display panel shown in FIG. 1. FIG. 5 is a schematic plan view of another aspect of a display panel shown in FIG. 1.

First, referring to FIG. 4, the pixels PXs may include first pixels Rs displaying a red color, second pixels Gs displaying a green color, and third pixels Bs displaying a blue color. On the display panel 50, pixels displaying the same color may be arranged in one pixel column. For example, the first pixels Rs may be arranged in a first pixel column, the second pixels Gs may be arranged in a second pixel column, and the third pixels Bs may be arranged in a third pixel column.

The first to the third pixels R, G, and B shown in FIG. 4 substantially represent emission areas EAs in which the light-emitting elements LDs of the pixels R, G, and B are arranged. The circuit elements constituting the pixels R, G, and B, for example, the transistors DT, ST, and SST, and the storage capacitor Cst may be placed below the light-emitting element LD and/or near the emission areas EAs (specifically, non-emission areas). However, the present disclosure is not limited thereto.

In an aspect, on the display panel 50, the first pixel column in which the first pixels Rs are arranged, the second pixel column in which the second pixels Gs are arranged, and the third pixel column in which the third pixels Bs are arranged may be placed alternately in the row direction X (stripe type). However, this aspect is not limited to that shown. In various aspects, the first pixel column in which the first pixels Rs are arranged, the second pixel column in which the second pixels Gs are arranged, the third pixel column in which the third pixels Bs are arranged, and a fourth pixel column in which the second pixels Gs are arranged may be placed alternately in the row direction X (PenTile type).

In this aspect, two or more adjacent pixels PX in one pixel column may form a pixel group PG. For example, referring to FIG. 4, pixels PXs arranged in one pixel column may be grouped by two to form pixel groups PGs. However, this aspect is not limited thereto. One pixel group PG may be configured to include more than two pixels PXs.

In an aspect, as shown in FIG. 4, the pixel groups PGs may be arranged in a zigzag shape with respect to the row direction X. For example, in the case where a j-th pixel group PG in the first pixel column consists of the first pixel R in an i-th pixel row and the first pixel R in an i+1-th pixel row, a j-th pixel group PG in the second pixel column may consist of the second pixel G in the i+1-th pixel row and the second pixel G in an i+2-th pixel row. In addition, a j-th pixel group PG in the third pixel column may consist of the third pixel B in the i-th pixel row and the third pixel B in the i+1-th pixel row.

Similarly, in the case where a j+1-th pixel group PG in the first pixel column consists of the first pixel R in the i+2-th pixel row and the first pixel R in an i+3-th pixel row, a j+1-th pixel group PG in the second pixel column may consist of the second pixel G in the i+3-th pixel row and the second pixel G in an i+4-th pixel row. In addition, a j+1-th pixel group PG in the third pixel column may consist of the third pixel B in the i+2-th pixel row and the third pixel B in the i+3-th pixel row.

However, the technical idea of this aspect is not limited thereto. That is, in other aspects, the pixel groups PGs may be arranged in a line with respect to the row direction X as shown in FIG. 5.

The bank 300 is formed near (around) the pixel groups PGs. The bank 300 has a shape extending in the column direction Y between pixel columns. In addition, the bank 300 has a shape extending in the row direction X between the pixel groups PGs.

This bank 300 may be formed of at least two layers of banks with hydrophilic property and/or hydrophobic property. For example, the bank 300 may be composed of a first bank with hydrophilic property, and a second bank formed on the first bank, the second bank being provided with at least one area thereof with hydrophobic property. In this aspect, the first bank may be formed between the pixels PX in the same pixel group PG. The detailed structure of the bank 300 will be described below with reference to the drawings.

In such an aspect, the emission layer 420 may be formed by applying a solution to form the emission layer 420 to an area surrounded by the bank 300, and drying the applied solution. Since the bank 300 has hydrophobic property, mixing of the solution at the opposite sides of the bank 300 is prevented. Since the bank 300 is formed in such a manner as to surround each pixel group PG, the emission layers 420 of the pixel groups PGs are separated from each other. Therefore, even when a defect occurs in the emission layer 420 due to the inflow of foreign substances during the solution process, the defect is not transferred to the pixels PX of the other pixel groups PGs.

In the solution process, the emission layer 420 may be formed integrally with respect to the pixels PXs included in one pixel group PG. That is, the pixels PXs included in one pixel group PG share one emission layer 420. As described above, when the emission layer 420 is formed by grouping the pixels PXs, the area to which the solution is applied is relatively wider than that of the case of forming the emission layer 420 for each of the pixels PXs, so that the process difficulty may be reduced and production efficiency of the display device 1 having high resolution may be increased.

Each of the pixels PXs may have the structure shown in FIGS. 2 and 3. Herein, the via holes VIAs for connecting the first electrodes 410 of the pixels PXs to the drain electrodes 213 of the driving transistors DTs may be formed being overlapped with the bank 300. For example, the via holes VIAs of the pixels PXs included in any pixel group PG may be placed being overlapped with the bank 300 that surrounds the pixel group PG. In particular, the via holes VIAs may be placed in such a manner as to be overlapped with the bank 300 extending in the row direction X between the pixel groups PGs arranged in the column direction Y.

Hereinafter, various structures of the bank 300 surrounding the pixel group PG and various aspects in which the via holes VIAs of the pixels PXs are placed in such a manner as to be overlapped with the bank 300 will be described in more detail.

Figure 6:
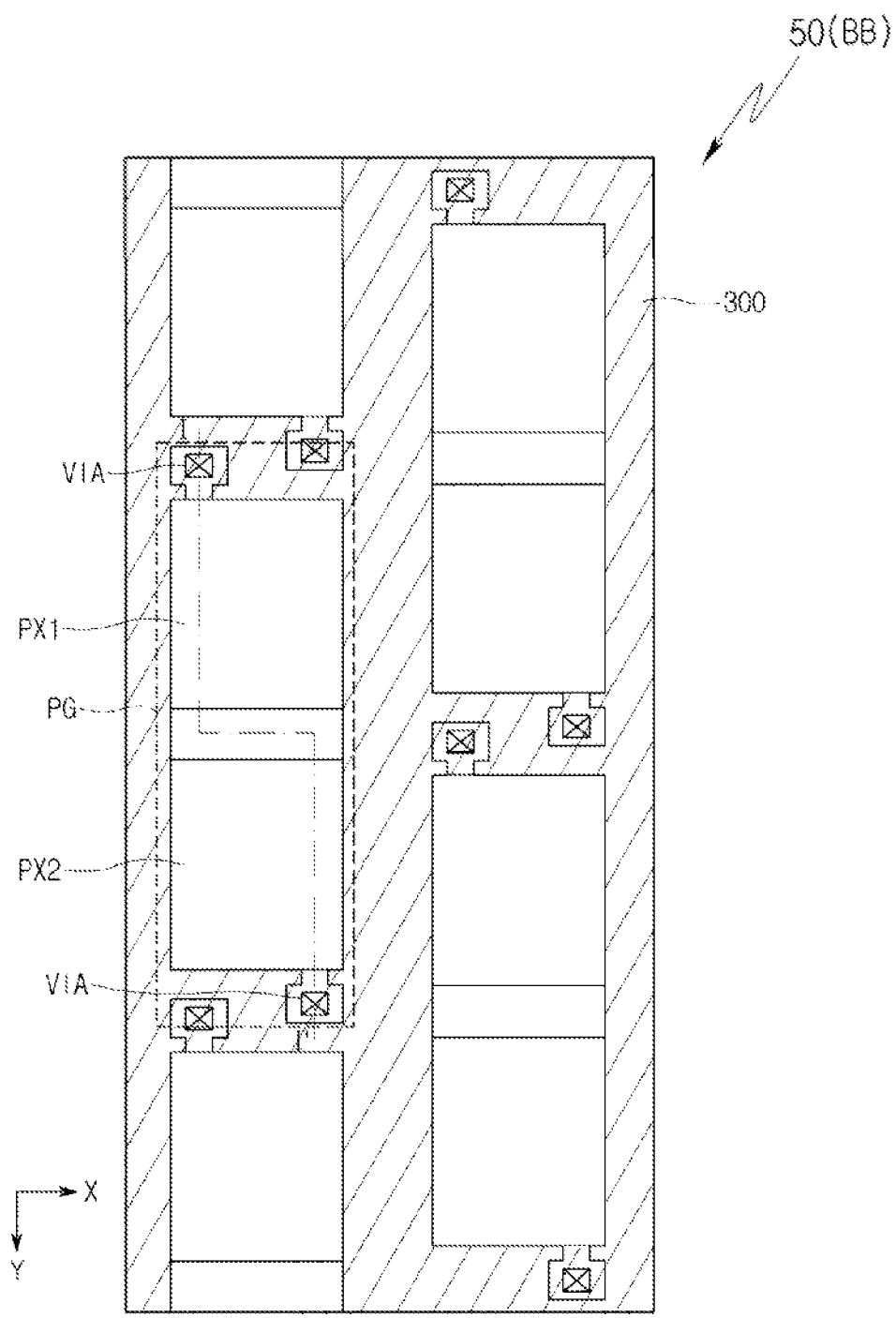
FIG. 6 is an enlarged view of area AA of FIG. 4.
Figure 7:
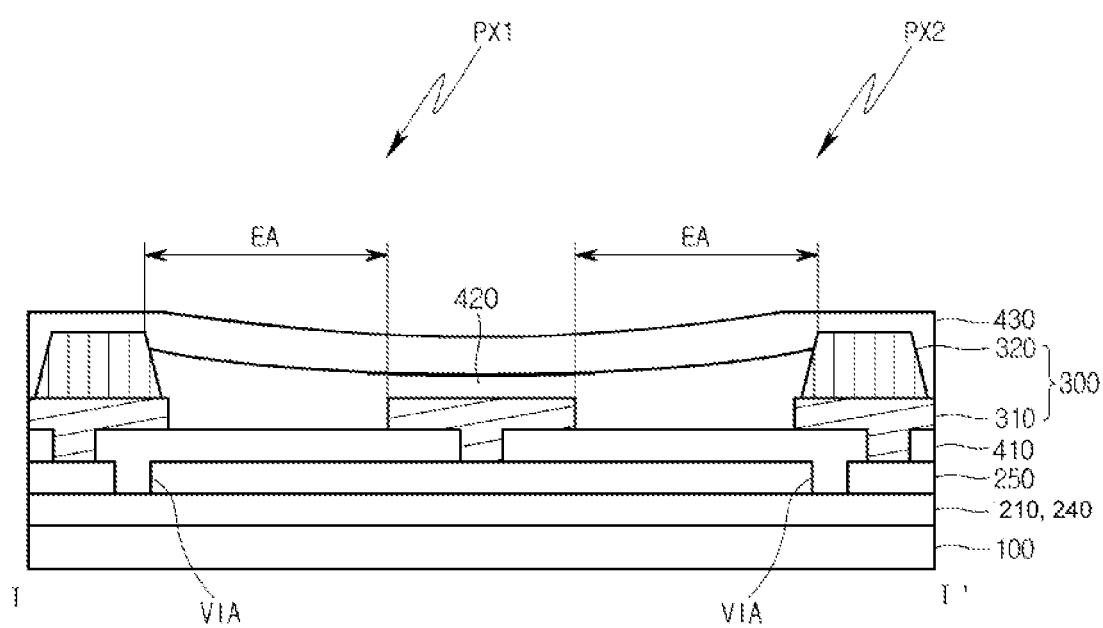
FIG. 7 is a diagram showing a first aspect of the present disclosure of a cross-section taken along line I-I' of FIG. 6.
Figure 8:
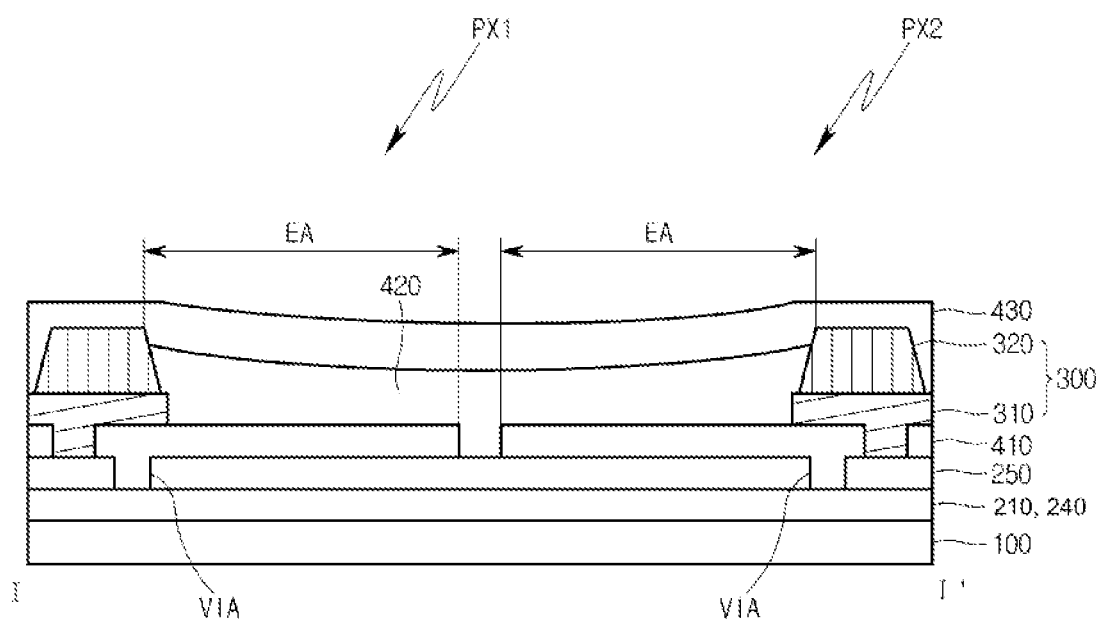
FIG. 8 is a diagram showing a second aspect of the present disclosure of a cross-section taken along line I-I' of FIG. 6.
Figure 9:
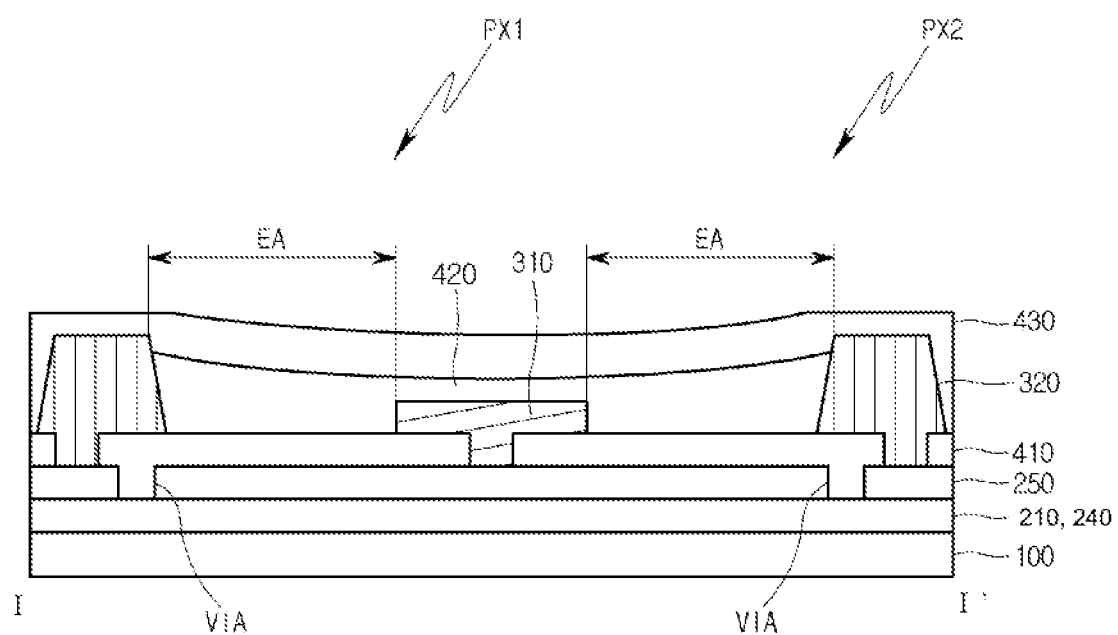
FIG. 9 is a diagram showing a third aspect of the present disclosure of a cross-section taken along line I-I' of FIG. 6.

FIG. 6 is an enlarged view of an aspect of area AA of FIG. 4. FIG. 7 is a diagram showing a first aspect of a cross section taken along line I-I' of FIG. 6. FIG. 8 is a diagram showing a second aspect of a cross section taken along line I-I' of FIG. 6. FIG. 9 is a diagram showing a third aspect of a cross section taken along line I-I' of FIG. 6. In FIGS. 7 to 9, for convenience of description, the active layer 210 to the passivation layer 240 are simply shown as one TFT substrate.

Referring to FIG. 6, in the shown aspects, each of the pixel groups PGs is composed of two pixels PX1 and PX2 adjacent in the column direction Y. As described above with reference to FIG. 3, the first electrode 410 of each of the pixels PX1 and PX2 is electrically connected to the drain electrode 213 of the driving transistor DT through the via hole VIA.

The bank 300 is formed near the pixels PX1 and PX2. The bank 300 is placed in such a manner as to surround each pixel group PG and/or each pixel PX1, PX2.

Referring to FIGS. 6 and 7 together, in the first aspect, the bank 300 may be composed of a first bank 310 having a hydrophilic property, and a second bank 320 having a hydrophobic property. The second bank 320 may be formed on at least an area of the first bank 310. Herein, the second bank 320 may be formed in such a manner as to be thicker than the first bank 310, and may be formed in such a manner as to be narrower than the first bank 310. However, the aspects are not limited thereto.

The first bank 310 may have a hydrophilic property. For example, the first bank 310 may be made of an inorganic insulation material such as a silicon oxide.

The first bank 310 may be a definition film defining the emission area EA of each of the pixels PX1 and PX2. In other words, the first bank 310 is placed near the emission area EA of each of the pixels PX1 and PX2. Herein, the first bank 310 may be formed to cover a part of the edge of the first electrode 410 of each of the pixels PX1 and PX2. The first bank 310 is placed in the shape of a grid extending between pixel rows and between pixel columns.

The second bank 320 may be formed in a pattern through a photolithography process after applying a solution that is a mixture of an organic insulation material with hydrophilic property and a hydrophobic material such as fluorine. Due to the light emitted during the photolithography process, the hydrophobic material such as fluorine may move to the top of the second bank 320, and the top of the second bank 320 may have a hydrophobic property. However, this aspect is not limited thereto. The entire portion of the second bank 320 may be formed to have a hydrophobic property.

The second bank 320 may be a definition film defining each of the pixel groups PGs. The second bank 320 is formed on the first bank 310 extending in the column direction Y between pixel columns. In addition, the second bank 320 is formed on the first bank 310 extending in the row direction X between the pixel groups PGs.

In this aspect, near each of the pixel groups PGs, the bank 300 of two layers including the first bank 310 and the second bank 320 formed on the first bank 310 may be formed. In addition, in the pixel groups PGs, the bank 300 of one layer including the first bank 310 may be formed at the boundary between the pixels PX1 and PX2.

On the display panel 50, when a solution for forming the emission layer 420 is applied, the solutions of the pixel groups PGs are separated from each other by the second bank 320 with hydrophobic property. In addition, due to the tension between the solution and the first bank 310 with hydrophilic property, the spread of the solution within the pixel groups PGs is enhanced, so that a pile-up of the emission layer 420 at the edge area may be prevented. In such a structure, the emission layer 420 may be formed integrally with respect to the pixels PX1 and PX2 included in one pixel group PG.

Referring to FIGS. 6 and 8 together, in the second aspect, the first bank 310 and the second bank 320 may be definition films defining each of the pixel groups PGs. The first bank 310 and the second bank 320 extend in the column direction Y between pixel columns and extend in the row direction X between the pixel groups PGs.

In this aspect, near each of the pixel groups PGs, the bank 300 of two layers including the first bank 310 and the second bank 320 formed on the first bank 310 may be formed. The bank 300 is not formed within the pixel group PG. The first electrode 410 is not formed at the boundary between the pixels PX1 and PX2 within the pixel group PG, and the overcoat layer 250 is exposed to the outside. The spread of the solution within the pixel group PG may be enhanced by the step difference between the first electrode 410 and the overcoat layer 250.

Referring to FIGS. 6 and 9 together, in the third aspect, only the second bank 320 with hydrophobic property is formed near each of the pixel groups PGs. The first bank 310 may be formed only at the boundary between the pixels PX1 and PX2 within the pixel group PG. In this aspect, the first bank 310 has a shape extending in the column direction Y between pixel columns.

In various aspects, the via hole VIA for electrically connecting the first electrode 410 of each of the pixels PX1 and PX2 to the drain electrode 213 of the driving transistor DT may be formed being overlapped with the bank 300. The via hole VIA is formed by etching the overcoat layer 250 and the passivation layer 240. When the first electrode 410 fills the inside of the via hole VIA and is formed on the via hole VIA, the incline and/or step difference of the surface of the first electrode 410 occur near the via hole VIA. When the emission layer 420 is formed on the area where the incline and/or step difference occurs, by using a solution process, the spread of the solution may deteriorate due to the incline and/or step difference near the via hole VIA.

In these aspects, the via hole VIA is formed in the area where the bank 300 is placed, and with the bank 300 near the via hole VIA for covering, the emission layer 420 is formed on the exposed first electrode 410. According to the aspects, the flatness of the area to which the solution is applied may be ensured, and the spread of the solution may be enhanced.

In the aspect shown in FIG. 6, the via hole VIA is placed being overlapped with an area of the bank 300 surrounding the pixel groups PGs. More specifically, referring to FIGS. 7 to 9, the via hole VIA is placed being overlapped with an area of the second bank 320 surrounding the pixel groups PGs. In this aspect, the via holes VIAs may be placed being overlapped with an area of the second bank 320 extending in the row direction X near the pixel group PG.

Since the via hole VIA is placed in such a manner as to be overlapped with an area of second bank 320, the drain electrode 213 of the driving transistor DT and the first electrode 410 of the light-emitting element LD that are electrically connected through the via hole VIA may include an extended part extending to an area of the second bank 320.

In order to minimize the extended length of the extended part, the via hole VIA may be placed being overlapped with an area of the second bank 320 relatively adjacent to the corresponding pixel PX1, PX2. Herein, according to the positions of the respective pixels PX1 and PX2 within the pixel group PG, areas of the second banks 320 adjacent to the pixels PX1 and PX2 may be positioned in different directions. Accordingly, the via holes VIAs may be placed in different directions within the pixels PX1 and PX2, respectively.

For example, as shown, in the case where the first and the second pixel PX1 and PX2 arranged in the column direction Y are included in one pixel group PG, the via hole VIA of the first pixel PX1 placed at the upper position may be placed being overlapped with an area of the second bank 320 extending in the row direction X from the upper portion of the first pixel PX1. The via hole VIA of the second pixel PX2 placed at the lower position may be placed being overlapped with an area of the second bank 320 extending in the row direction X from the lower portion of the second pixel PX2.

As shown, when the positions of the via holes VIAs for the pixels PX1 and PX2 placed within the same pixel group PG are different, the layouts of the pixels PX1 and PX2 are configured differently. For example, in the case where the via hole VIA of the first pixel PX1 is placed at the upper position and the via hole VIA of the second pixel PX2 is placed at the lower position, the layouts of the two pixels PX1 and PX2 may be symmetric with respect to the row direction X (mirroring).

Hereinafter, the detailed layouts of the pixels PX1 and PX2 which are symmetric with respect to the row direction X according to the positions of the via holes VIAs placed within the pixel group PG will be described.

Figure 10:
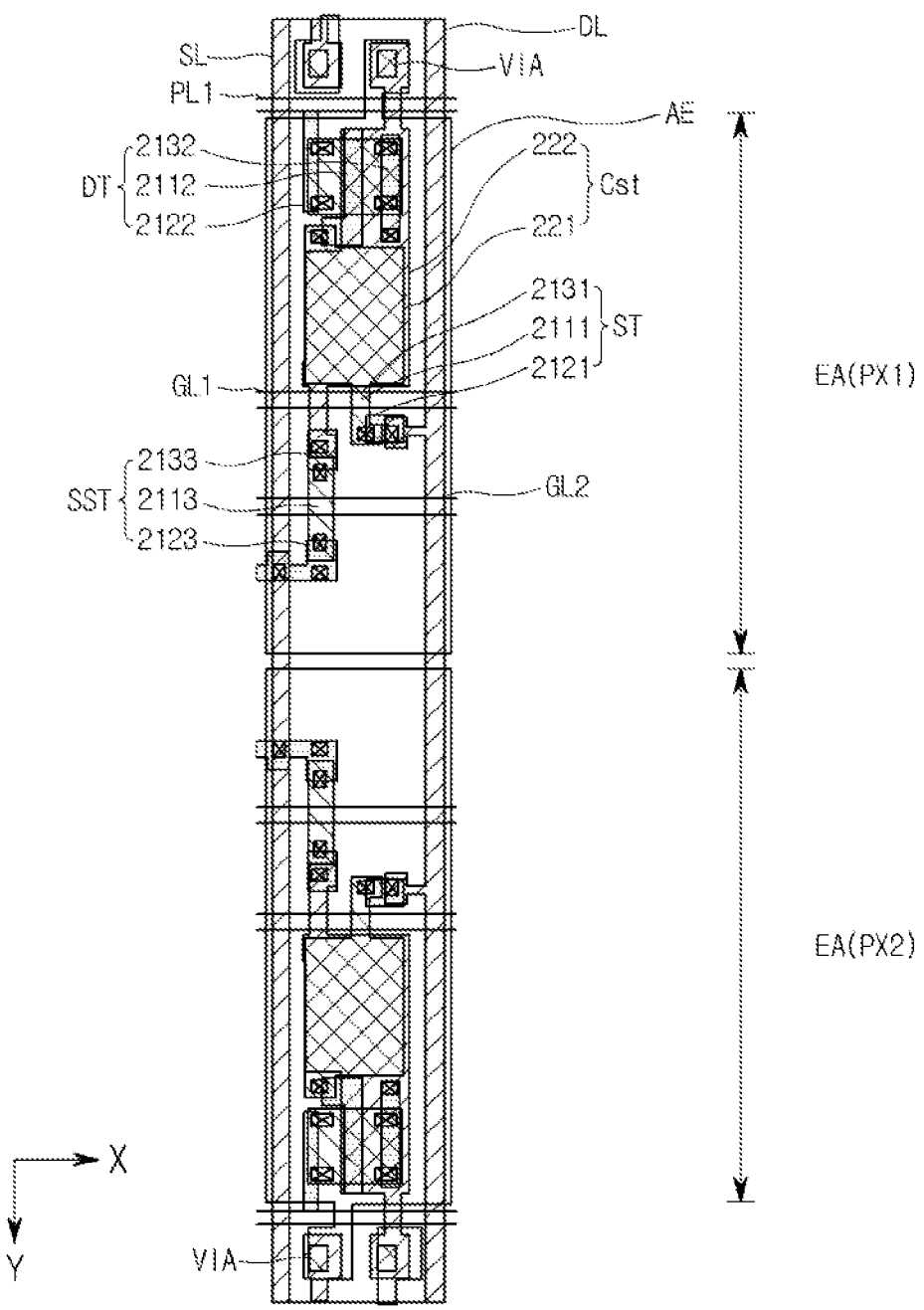
FIG. 10 is a diagram showing a detailed layout of area BB shown in FIG. 6.

FIG. 10 is a diagram showing a detailed layout of area BB shown in FIG. 6. Referring to FIG. 10 in conjunction with the above-described aspects, the display panel 50 may include the light-emitting element LD placed in the emission area EA, and circuit elements placed in the emission area EA and/or the nearby area. The light-emitting element LD and the circuit elements may constitute one pixel PX1, PX2. In addition, the display panel 50 may further include a wire area WA placed near the emission area EA. In the wire area WA, one or more driving lines for driving the circuit elements may be placed.

First, a layout of the first pixel PX1 within the pixel group PG will be described.

A first gate line GL1 and a second gate line GL2 may extend in the row direction X in such a manner as to cross the emission area EA. For one emission area EA, the first gate line GL1 and the second gate line GL2 may be sequentially arranged along the column direction Y substantially perpendicular to the row direction X. The first gate line GL1 may receive a gate signal from the gate driver 20. The second gate line GL2 may receive a sensing signal from the gate driver 20.

A data line DL may extend in the column direction Y from the wire area WA. That is, the data line DL may extend in the direction substantially perpendicular to the first gate line GL1 and the second gate line GL2. The data line DL may receive a data signal from the data driver 30.

A sensing line SL may extend in the column direction Y from the wire area WA. That is, the sensing line SL may extend in the direction substantially parallel to the data line DL. The sensing line SL may receive a reference voltage from the data driver 30, or may transmit an electrical signal output from the corresponding pixel PX1, PX2, to the data driver 30. In the case where the data line DL is provided in the wire area WA on one side of the emission area EA, the sensing line SL may be provided in the wire area WA on another side of the emission area EA.

As described above with reference to FIG. 2, each of the pixels PX1 and PX2 may include the switching transistor ST, the driving transistor DT, the sensing transistor SST, the storage capacitor Cst, and the light-emitting element LD.

The switching transistor ST may include a first gate electrode 2111, a first source electrode 2121, and a first drain electrode 2131.

The first gate electrode 2111 may be placed overlapping a channel area formed in the active layer 210 (shown in FIG. 3). The channel area may be a semiconductor pattern to which impurities are not doped within the active layer 210. Between the first gate electrode 2111 and the channel area, at least one insulation layer, for example, the gate insulation layer 220 (shown in FIG. 3) may be placed. The first gate electrode 2111 may be electrically connected to the first gate line GL1.

The first source electrode 2121 and the first drain electrode 2131 may be connected to the opposite sides of the channel area in the active layer 210 through contact holes, respectively. The first source electrode 2121 may be further connected to the data line DL through a contact hole. The first drain electrode 2131 may be electrically connected to an upper electrode 221 of the storage capacitor Cst. For example, the first drain electrode 2131 may be formed integrally with the upper electrode 221 of the storage capacitor Cst.

The driving transistor DT may include a second gate electrode 2112, a second source electrode 2122, and a second drain electrode 2132.

The second gate electrode 2112 may be placed overlapping the channel area formed in the active layer 210. Between the second gate electrode 2112 and the channel area, at least one insulation layer, for example, the gate insulation layer 220 may be placed. The second gate electrode 2112 may be electrically connected to the upper electrode 221 of the storage capacitor Cst through a contact hole.

The second source electrode 2122 and the second drain electrode 2132 may be connected to the opposite sides of the channel area in the active layer 210 through contact holes, respectively. The second source electrode 2122 may be connected to a first power line PL1 through which the high-potential driving voltage ELVDD is applied. For example, the second source electrode 2122 may be configured as an extended part protruding in the column direction Y from the first power line PL1 extending in the row direction X. The second drain electrode 2132 may be connected to the light blocking layer 110 through a contact hole. As described later, the light blocking layer 110 is connected to the first electrode 410 through the via hole VIA, so that the second drain electrode 2132 may be connected to the first electrode 410, passing through the light blocking layer 110.

The sensing transistor SST may include a third gate electrode 2113, a third source electrode 2123, and a third drain electrode 2133.

The third gate electrode 2113 may be placed overlapping the channel area formed in the active layer 210. Between the third gate electrode 2113 and the channel area, at least one insulation layer, for example, the gate insulation layer 220 may be placed. The third gate electrode 2113 may be electrically connected to the second gate line GL2.

The third source electrode 2123 and the third drain electrode 2133 may be connected to the opposite sides of the channel area in the active layer 210 through contact holes, respectively. The third source electrode 2123 may be connected to the sensing line SL through a contact hole. The third drain electrode 2133 may be electrically connected to a lower electrode 222 of the storage capacitor Cst through a contact hole.

The storage capacitor Cst may include the upper electrode 221 and the lower electrode 222.

The lower electrode 222 may be formed in one pattern electrically connected to the light blocking layer 110. The lower electrode 222 may be electrically connected to the third drain electrode 2133 of the sensing transistor SST through a contact hole, and may be connected to the second drain electrode 2132 of the driving transistor DT and the first electrode 410, passing through the light blocking layer 110.

The upper electrode 221 may be formed in such a manner that at least an area thereof covers the lower electrode 222. Between the upper electrode 221 and the lower electrode 222, electric charges corresponding to the potential difference between the two electrodes are stored, so that the upper electrode 221 and the lower electrode 222 may operate as the storage capacitor Cst.

The upper electrode 221 may be formed integrally with the first drain electrode 2131 of the switching transistor ST. The upper electrode 221 may be connected to the second gate electrode 2112 of the driving transistor DT through a contact hole.

The light-emitting element LD may include the first electrode 410, the second electrode 430, and the emission layer 420 placed between the first electrode 410 and the second electrode 430 (see FIG. 3). In an aspect, the first electrode 410 and the second electrode 430 may be placed in such a manner as to overlap each other in the emission area EA.

The first electrode 410 may be placed in the emission area EA. The first electrode 410 may be connected to the second drain electrode 2132 of the driving transistor DT through the via hole VIA. On the first electrode 410, the emission layer 420 and the second electrode 430 may be placed. The emission layer 420 and the second electrode 430 may be formed widely on the display panel 50.

In the above aspect, the via hole VIA is placed being overlapped with the bank 300 that surrounds the pixel group PG to which the first pixel PX1 belongs, as described above with reference to FIGS. 6 to 9. Specifically, the via hole VIA of the first pixel PX1 placed at the upper end of the pixel group PG is formed being overlapped with the bank 300 placed at the upper end of the pixel group PG as shown.

The above-described layout of the first pixel PX1 and a layout of the adjacent second pixel PX2 belonging to the same pixel group PG as the first pixel PX1 are symmetric in structure with respect to the row direction X. In this aspect, the via hole of the second pixel PX2 placed at the lower end of the pixel group PG is formed being overlapped with the bank 300 placed at the lower end of the pixel group PG as shown.

Figure 11:
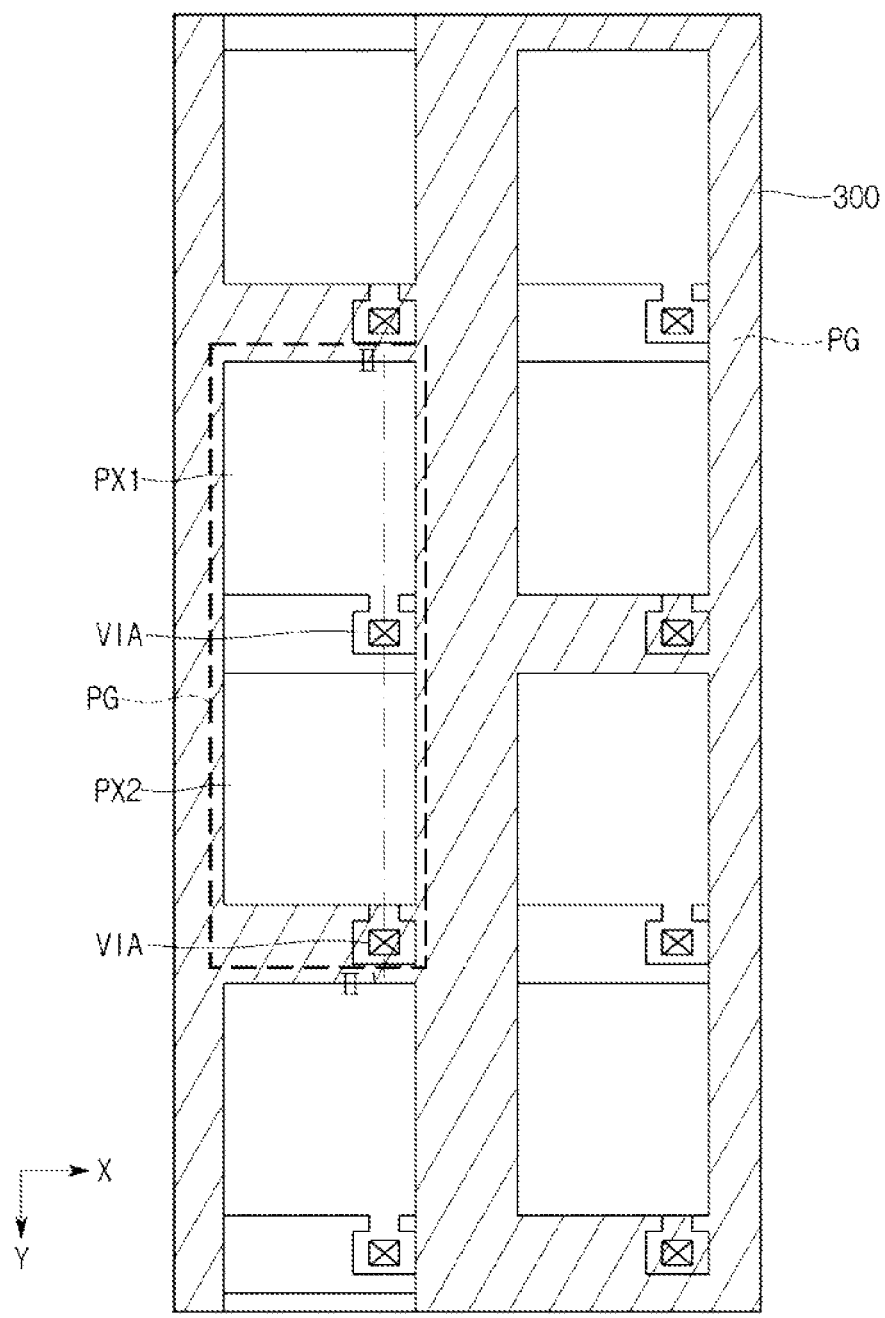
FIG. 11 is an enlarged view of another aspect of area AA of FIG. 4.
Figure 12:
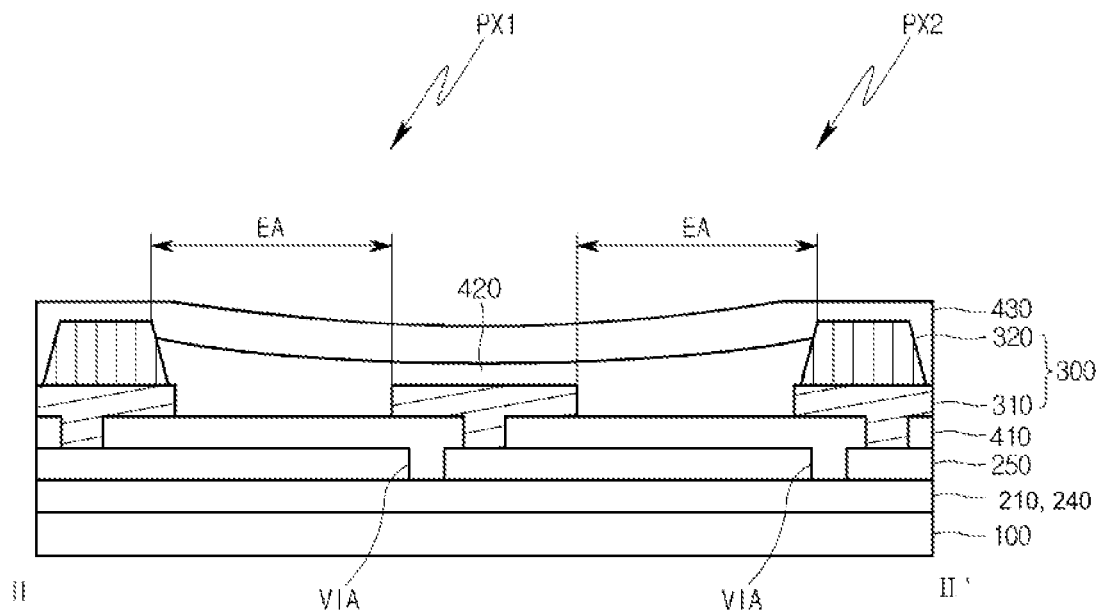
FIG. 12 is a diagram showing a first aspect of the present disclosure of a cross-section taken along line II-II' of FIG. 11.
Figure 13:
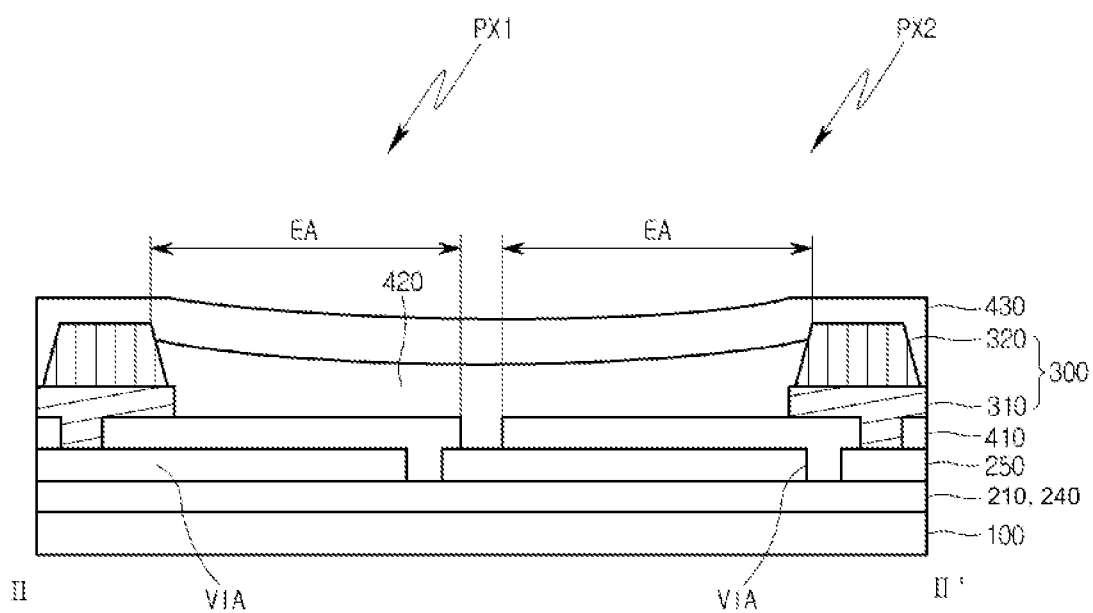
FIG. 13 is a diagram showing a second aspect of the present disclosure of a cross-section taken along line II-II' of FIG. 11.
Figure 14:
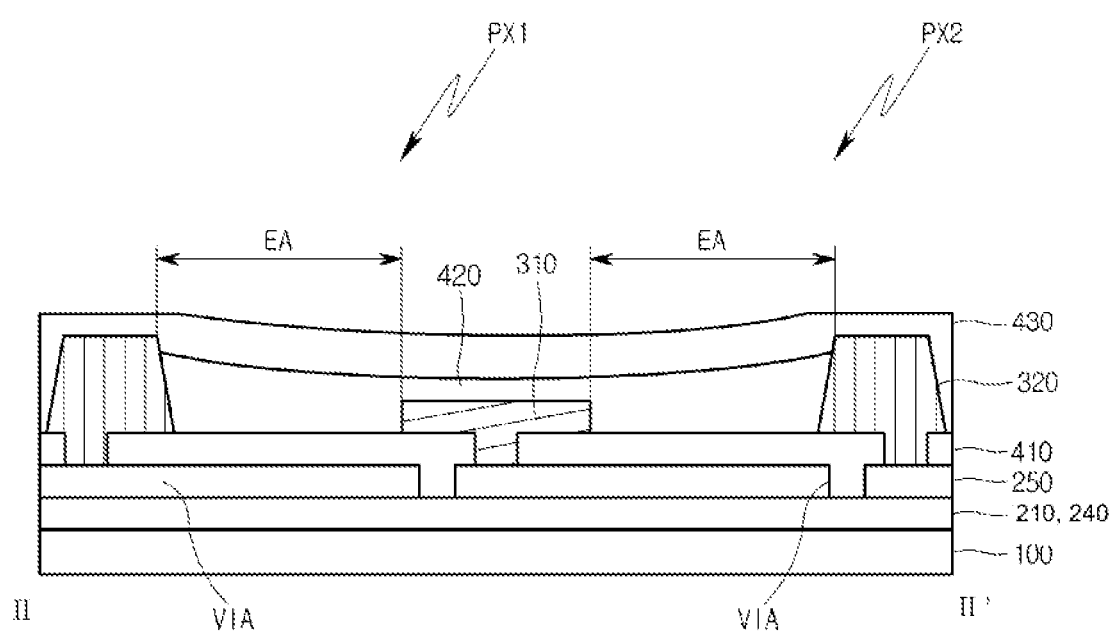
FIG. 14 is a diagram showing a third aspect of the present disclosure of a cross-section taken along line II-II' of FIG. 11.

FIG. 11 is an enlarged view of another aspect of area AA of FIG. 4. FIG. 12 is a diagram showing a first aspect of a cross section taken along line of FIG. 11. FIG. 13 is a diagram showing a second aspect of a cross section taken along line of FIG. 11. FIG. 14 is a diagram showing a third aspect of a cross section taken along line of FIG. 11.

The aspects of FIGS. 11 to 14 are substantially the same as the aspect of FIG. 6 except that the arrangement of the via holes VIAs is changed. Therefore, the same element as in the aspect of FIG. 6 is denoted by the same reference numeral, and a detailed description thereof will be omitted.

Referring to FIG. 11, in the shown aspects, each of the pixel groups PGs is composed of two pixels PX1 and PX2 adjacent in the column direction Y. As described above with reference to FIG. 3, the first electrode 410 of each of the pixels PX1 and PX2 is electrically connected to the drain electrode 213 of the driving transistor DT through the via hole VIA.

The bank 300 is formed near the pixels PX1 and PX2. The bank 300 is placed in such a manner as to surround each pixel group PG and/or each pixel PX1, PX2.

Referring to FIGS. 11 and 12 together, in the first aspect, the bank 300 may be composed of a first bank 310 having a hydrophilic property, and a second bank 320 having a hydrophobic property. The first bank 310 may be a definition film defining the emission area EA of each of the pixels PX1 and PX2. In other words, the first bank 310 is placed near the emission area EA of each of the pixels PX1 and PX2. The second bank 320 may be a definition film defining each of the pixel groups PGs. The second bank 320 is formed on the first bank 310 extending in the column direction Y between pixel columns. In addition, the second bank 320 is formed on the first bank 310 extending in the row direction X between the pixel groups PGs.

In this aspect, near each of the pixel groups PGs, the bank 300 of two layers including the first bank 310 and the second bank 320 formed on the first bank 310 may be formed. In addition, in the pixel groups PGs, the bank 300 of one layer including the first bank 310 may be formed at the boundary between the pixels PX1 and PX2.

Referring to FIGS. 11 and 13 together, in the second aspect, the first bank 310 and the second bank 320 may be definition films defining each of the pixel groups PGs. The first bank 310 and the second bank 320 extend in the column direction Y between pixel columns and extend in the row direction X between the pixel groups PGs.

In this aspect, near each of the pixel groups PGs, the bank 300 of two layers including the first bank 310 and the second bank 320 formed on the first bank 310 may be formed. The bank 300 is not formed within the pixel group PG. Referring to FIGS. 11 and 14 together, in the third aspect, only the second bank 320 with hydrophobic property is formed near each of the pixel groups PGs. The first bank 310 may be formed only at the boundary between the pixels PX1 and PX2 within the pixel group PG. In this aspect, the first bank 310 has a shape extending in the column direction Y between pixel columns.

In various aspects, the via hole VIA for electrically connecting the first electrode 410 of each of the pixels PX1 and PX2 to the drain electrode 213 of the driving transistor DT may be formed being overlapped with the bank 300.

In the aspect shown in FIG. 11, the via hole VIA is placed being overlapped with an area of the bank 300 that surrounds the emission areas EAs of the respective pixels PX1 and PX2. More specifically, referring to FIGS. 12 to 14, the via hole VIA is placed being overlapped with an area of the first bank 310 and/or the second bank 320 surrounding the emission areas EAs of the respective pixels PX1 and PX2. In this aspect, the via holes VIAs may be placed being overlapped with an area of the first bank 310 and/or the second bank 320 extending in the row direction X near the pixel group PG.

Compared to the aspect of FIG. 6, in the aspect of FIG. 11, the via holes VIAs are placed in the same direction within the pixels PX1 and PX2. For example, as shown, in the case where the first and the second pixel PX1 and PX2 arranged in the column direction Y are included in one pixel group PG, the via hole VIA of the first pixel PX1 placed at the upper position may be placed being overlapped with an area of the first bank 310 extending in the row direction X from the lower portion of the first pixel PX1. The via hole VIA of the second pixel PX2 placed at the lower position may be placed being overlapped with an area of the second bank 320 extending in the row direction X from the lower portion of the second pixel PX2.

As shown, when the positions of the via holes VIAs for the pixels PX1 and PX2 placed within the same pixel group PG are the same, the layouts of the pixels PX1 and PX2 are configured the same. That is, while in FIG. 10, the pixels PX1 and PX2 have layouts inverted up and down, in the aspects of FIGS. 11 to 14, the pixels PX1 and PX2 may have the same type of layout. The layouts of the pixels PX1 and PX2 are the same as the layout of the first pixel PX1 described with reference to FIG. 10, and thus a detailed description thereof will be omitted.

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
   a substrate in which pixel groups each composed of two or more pixels adjacent in a column direction are arranged;
   a circuit element layer in which driving transistors driving the pixels are arranged;
   electrodes placed on the circuit element layer and electrically connected to the driving transistors through via holes;
   a bank surrounding each of the pixel groups and covering at least a part of an edge of the electrodes; and
   emission layers formed within areas surrounded by the bank,
   wherein the pixel groups are arranged in zigzag lines along a row direction,
   wherein the bank comprises:

a first bank surrounding each of the pixels; and
a second bank being on the first bank and surrounding each of the pixel groups, and
wherein the via hole overlaps with the second bank.

2. The display device of claim 1, wherein the bank comprises:
a first bank surrounding each of the pixel groups; and
a second bank disposed on the first bank.

3. The display device of claim 1, wherein the bank comprises:
a first bank placed between the two or more pixels within the pixel groups; and
a second bank surrounding each of the pixel groups.

4. The display device of claim 1, wherein each of the pixel groups comprises:
a first pixel; and
a second pixel of which a first side is adjacent to a first side of the first pixel,
wherein the via hole of the first pixel overlaps with the second bank on a second side of the first pixel, and
wherein the via hole of the second pixel overlaps with the second bank on a second side of the second pixel.

5. The display device of claim 4, wherein a layout of the first pixel and a layout of the second pixel are symmetric with respect to the row direction.

6. The display device of claim 5, wherein the circuit element layer comprises:
a first conductive layer formed on the substrate, and including a light blocking layer;
a buffer layer covering the light blocking layer;
an active layer placed on the buffer layer;
a gate insulation layer placed on the active layer;
a second conductive layer in which a gate electrode, a drain electrode, and a source electrode of the driving transistor are placed, the second conductive layer being placed on the gate insulation layer; and
an overcoat layer covering the second conductive layer,
wherein the electrodes are connected to the light blocking layer through the via hole overlapping with the first bank, and
wherein the light blocking layer is connected to the drain electrode of the driving transistor through a contact hole.

7. The display device of claim 1, wherein some of the via holes overlap with the second bank that surrounds each of the pixel groups, and the other via holes are disposed between the pixels within the pixel groups.

8. The display device of claim 7, wherein each of the pixel groups comprises:
a first pixel; and
a second pixel of which a first side is disposed adjacent to a first side of the first pixel,
wherein the via hole of the first pixel is disposed between the first pixel and the second pixel on a first side of the first pixel, and
wherein the via hole of the second pixel overlaps with the second bank on a second side of the second pixel.

9. The display device of claim 8, wherein a layout of the first pixel and a layout of the second pixel are identical with each other.

10. The display device of claim 1, wherein the emission layers are formed integrally with respect to the two or more pixels constituting one pixel group.

11. The display device of claim 10, wherein the emission layers in central areas of the pixel groups are formed in such a manner to be thicker than the emission layers in edge areas adjacent to the bank.

12. A display device comprising:
a substrate in which pixel groups each composed of two or more pixels adjacent in a column direction are arranged;
a circuit element layer in which driving transistors driving the pixels are arranged;
electrodes placed on the circuit element layer, and electrically connected to the driving transistors through via holes;
a bank surrounding each of the pixel groups and covering at least a part of an edge of the electrodes; and
emission layers formed within an area surrounded by the bank,
wherein the via holes are covered by the bank,
wherein the bank comprises:
a first bank surrounding each of the pixels; and
a second bank being on the first bank, and surrounding each of the pixel groups, and
wherein the via hole overlaps with the second bank.

13. The display device of claim 12, wherein the bank comprises:
a first bank surrounding each of the pixel groups; and
a second bank placed on the first bank.

14. The display device of claim 12, wherein the bank comprises:
a first bank placed between the pixels within the pixel groups; and
a second bank surrounding each of the pixel groups.

* * * * *